United States Patent [19]

Crockett

[11] 4,413,193
[45] Nov. 1, 1983

[54] OPTICALLY COUPLED SOLID STATE RELAY

[75] Inventor: Charles R. Crockett, Arlington, Tex.

[73] Assignee: Teccor Electronics, Inc., Euless, Tex.

[21] Appl. No.: 272,518

[22] Filed: Jun. 11, 1981

[51] Int. Cl.³ .................. H03K 17/60; H03K 23/12
[52] U.S. Cl. .................. 307/311; 307/252 T; 307/252 UA; 307/317 R
[58] Field of Search ........ 307/252 T, 252 UA, 252 P, 307/311, 317; 250/211 J

[56] References Cited

U.S. PATENT DOCUMENTS

| | | | |
|---|---|---|---|
| 3,691,403 | 9/1972 | Newmeyer | 307/311 |
| 3,723,769 | 3/1973 | Collins | 307/252 T |
| 3,881,118 | 4/1975 | Forrest et al. | 307/252 UA |
| 4,129,791 | 12/1978 | Sata | 307/252 UA |
| 4,158,150 | 6/1979 | Dever | 307/252 UA |

OTHER PUBLICATIONS

IBM Tech. Disclre. Bltn., Photodetector and Method of Calibrating Same by R. S. Palmer, vol. 16, No. 8, Jan. 1974, pp. 2469 and 2470.

*Primary Examiner*—S. D. Miller
*Assistant Examiner*—B. P. Davis
*Attorney, Agent, or Firm*—Hubbard, Thurman, Turner & Tucker

[57] ABSTRACT

An optically coupled solid state relay circuit is disclosed. A light emitting diode input circuit is utilized to trigger a photosensitive transistor. A trim resistor in the base of the photosensitive transistor is utilized to adjust the sensitivity of the circuit. The photosensitive transistor is utilized, in conjunction with other circuitry, to control a silicon controlled rectifier which provides gate drive to a triac. Voltage limiting circuitry is provided to insure that the solid state relay will switch only during those periods within a selected range of the zero crossing of the line voltage and half of the bridge circuit which provides single polarity operating voltages is comprised of fast recovery diodes to improve the circuit's ability to withstand rapid polarity reversals.

11 Claims, 1 Drawing Figure

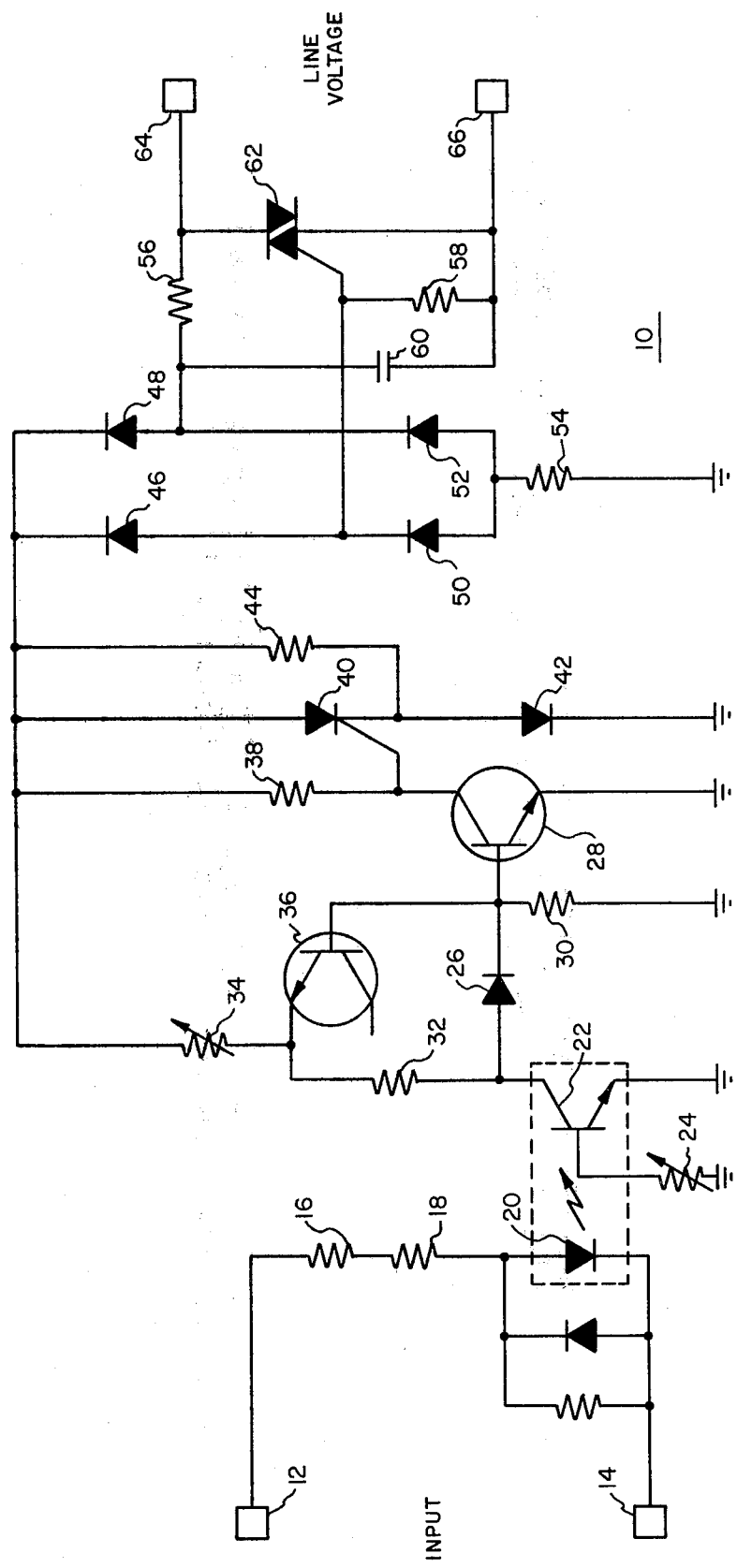

OPTICALLY COUPLED SOLID STATE RELAY

BACKGROUND OF THE INVENTION

This invention relates to optically coupled relays and more particularly to optically coupled relay circuits which employ adjustable means to insure accurate operation.

The utilization of optical coupling of switching circuits is a well-known method of isolating a control signal from the controlled circuit. Numerous problems have been encountered with such known optically coupled circuitry, including, but not limited to; variations in individual photosensitive circuit sensitivity to common mode noise, inconsistent response to variations in load conditions, dv/dt breakdown and the problems encountered due to switching during high voltage periods of the line voltage.

One example of a known optically coupled relay circuit which utilizes a solid state bilateral switching device and a photodarlington may be seen on page 21 of "Photon Couplers," General Electric, Semiconductor Products Department, Auburn, N.Y., No. 200.62. The circuit depicted therein makes no attempt to adjust the sensitivity of the photosensitive transistor or to compensate for variations in loads, but merely controls a triac through a diode bridge.

A more sophisticated example of such circuitry may be seen in a Hewlett Packard publication, "Electrical Isolation Using the HP 5082-4310,+ No. 909, 1968. The circuit depicted therein utilizes a preamp with a high frequency response to increase the high speed performance of the coupler. Again, there is no method disclosed of assuring uniform sensitivity or compensation due to load variations.

SUMMARY OF THE INVENTION

It is therefore an object of this invention to provide an improved solid state optically coupled relay circuit.

It is yet another object of this invention to provide an optically coupled relay circuit wherein the sensitivity of the photosensitive transistor may be adjusted.

It is yet another object of this invention to provide an optically coupled relay circuit which has high dv/dt withstand capability.

It is another object of this invention to provide an optically coupled relay circuit which will not conduct if the line voltage is above a selected limit.

The foregoing objects are achieved as is now described. A light emitting diode input circuit is utilized to trigger a photosensitive transistor. A trim resistor in the base of the photosensitive transistor is utilized to adjust the sensitivity of the circuit. The photosensitive transistor is utilized, in conjunction with other circuitry, to control a silicon controlled rectifier which provides gate drive to a triac. Voltage limiting circuitry is provided to ensure that the solid state relay will not switch unless the live voltage is below a selected level. A diode bridge circuit is utilized to provide single polarity operating voltages to the circuitry of the solid state relay of the present invention and one-half of the diodes employed therein are fast recovery diodes to improve the circuit's ability to withstand rapid polarity reversals.

BRIEF DESCRIPTION OF THE DRAWING

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawing, wherein:

FIG. 1, depicts a schematic diagram of the optically coupled solid state relay circuit of the present invention.

DETAILED DESCRIPTION OF THE INVENTION

With reference now to FIG. 1, there is depicted a schematic representation of the optically coupled solid state relay of the present invention.

The solid state relay of the present invention, as is the case with all relays, is a two state device. To facilitate understanding of the operation of the present invention, the circuit depicted in schematic form in FIG. 1 will be separately described in both states.

INPUT LOW-RELAY OPEN

In this state, no input is applied to the input pins 12 and 14. Thus, light emitting diode 20 will not operate and photosensitive transistor 22 will not conduct.

A line voltage, preferably 110 volts AC, is present on pins 64 and 66 and will be rectified by the full wage rectification circuit formed by the diode bridge consisting of diodes 46, 48, 50 and 52. The diode bridge is utilized to provide the unipolar operating voltages for the remaining circuit components of the solid state relay of the present invention.

Photosensitive transistor 22, while not conducting, will permit base current from transistor 28 to conduct via diode 26, resistor 32 and resistor 34. In the depicted circuitry, transistor 28 will be biased into the saturation mode under these conditions and the voltage present at the gate of silicon controlled rectifier 40 will be approximately 0.2 volts. Biasing diode 42 will also conduct and the voltage present at the cathode of silicon controlled rectifier 40 will therefore be approximately 0.5 volts.

The use of biasing diode 42 is an important feature of the present invention because it ensures that the gate of silicon controlled rectifier 40 is negatively biased and therefore results in better blocking and higher dv/dt withstand capabilities for the solid state relay of the present invention.

Silicon controlled rectifier 40 is utilized to complete the gate drive circuit of triac 62. Triac 62 is utilized as a bilateral switching device in series with any load over which control is desired. Since silicon controlled rectifier 40 is negatively biased, triac 62 will not conduct and the solid state relay of the present invention will be "open."

INPUT HIGH-RELAY CLOSED

In the alternate state, a direct current input signal is applied to input pins 12 and 14. The input signal is utilized to energize light emitting diode 20 through resistors 16 and 18. Resistors 16 and 18 may be chosen to ensure energization of light emitting diode 20 in the presence of a typical input signal.

The photons emitted by light emitting diode 20 impact upon photosensitive transistor 22 and, if present in sufficient number, will cause photosensitive transistor 22 to conduct. A trim resistor 24 is coupled to the base of photosensitive transistor 22 and is utilized, in an important feature of the present invention, to vary the sensitivity of photosensitive transistor 22.

Trim resistor 24 may be increased or decreased to increase or decrease the sensitivity of photosensitive transistor 22. Thus, a plurality of such circuits may each be adjusted to change states in response to the application of a particular magnitude of input signal. This adjustment will allow a consistent sensitivity to common mode noise and will result in improved reliability of operation.

As photosensitive transistor 22 begins to conduct, the base circuitry of transistor 28 is effectively shorted out by the low impedance circuit consisting of photosensitive transistor 22 in a forward biased state. Transistor 28 will then cease conduction unless an alternate path for base current is available.

Transistor 36 is provided to enable transistor 28 to remain in saturation in certain conditions. Transistor 36 is utilized, in a preferred embodiment of the present invention, in the manner of a zener diode. A transistor rather than a diode is utilized to minimize possible leakage current. Those ordinarily skilled in the art will appreciate that a transistor thus configured will not have the current handling capability of a zener diode; however, since small currents will be present and low leakage current is desired, such a configuration is ideal.

Transistor 36 thus forms a voltage limiting circuit which will conduct when the voltage present at the emitter exceeds a selected voltage. In a preferred embodiment, transistor 36 will conduct when the voltage present at the emitter exceeds six volts. This voltage limiter circuit will then provide an alternate path for bath current from transistor 28 when the line voltage exceeds the selected level. The actual level of line voltage required to put six volts on the emitter of transistor 36 may be calculated in view of the voltage divider formed by resistors 32 and 34.

Resistor 34, in a preferred embodiment, may be adjusted to vary the level at which the line voltage must be in order to put six volts on the emitter of transistor 36, and thereby determines how close to a zero crossing the line voltage must be in order to operate the relay. This important feature assures operation of the relay during low voltage periods of the line voltage supply.

Assuming that transistor 36 is not conducting (the line voltage is below the selected level), when photosensitive transistor 22 conducts, transistor 28 will cease conduction. As transistor 28 ceases conduction, the rectified line voltage is present upon the gate of silicon controlled rectifier 40 and silicon controlled rectifier 40 will conduct.

As silicon controlled rectifier 40 conducts, triac 62 will complete its gate circuit and begin conduction. As triac 62 conducts, voltage to the remainder of the relay circuit will be shorted out; however, triac 62 will continue to conduct as long as a minimum current is present.

Two of the diodes in the diode bridge circuit, diodes 46 and 48, are fast recovery diodes. This important feature of the relay circuit of the present invention allows the bridge circuit to withstand rapid polarity reversals which may occur due to the reactance of certain loads.

The solid state optical coupled relay circuit of the present invention will also drive dual silicon controlled rectifiers in place of triac 62, as a matter of simple design choice.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An optically coupled switching circuit adapted for controlling an alternating current power source, said switching circuit comprising:

means for emitting light in response to the application of an input signal;

a photosensitive transistor for detecting said light and for commencing conduction in response thereto;

detecting means including a reversed biased transistor emitter-base junction for precisely detecting the point at which said alternating current power source equals a particular voltage;

a gate controlled bilateral switching device for connection in series with said alternating current power source; and means coupled to said photosensitive transistor and said detecting means, for triggering said gate controlled bilateral switching device in response to the conduction of said photosensitive transistor, if said alternating current power source is less than said particular voltage.

2. The switching circuit according to claim 1 wherein said means for emitting light comprises a light emitting diode.

3. The switching circuit according to claim 1 wherein said gate controlled bilateral switching device comprises a triac.

4. An optically coupled switching circuit adapted for controlling an alternating current power source, said switching circuit comprising:

means for emitting light in response to the application of an input signal;

a photosensitive transistor for detecting said light and for commencing conduction in response thereto;

detecting means including a reversed biased transistor emitter-base junction for precisely detecting a point at which said alternating current power source exceeds a particular voltage;

means for selecting said particular voltage;

a gate controlled bilateral switching device for connection in series with said alternating current power source; and means coupled to said photosensitive transistor and said detecting means, for triggering said gate controlled bilateral switching device in response to the conduction of said photosensitive transistor, if said alternating current power source is less than said particular voltage.

5. The switching circuit according to claim 4 wherein said means for emitting light comprises a light emitting diode.

6. The switching circuit according to claim 4 wherein sad gate controlled bilateral switching device comprises a triac.

7. An optically coupled switching circuit adapted for controlling an alternating current power source, said switching circuit comprising:

means for emitting light in response to the application of an input signal;

a photosensitive transistor for detecting said light and for commencing said conduction in response thereto;

a gate controlled bilateral switching device for connection in series with said alternating current power source;

trigger means for triggering said bilateral switching device in response to the conduction of said photosensitive transistor; and rectifier means, comprising a plurality of diodes and for connection to said alternating current power source, for providing a single polarity voltage source for said photosensitive transistor and said trigger means, half of said plurality of diodes comprising fast recovery diodes.

8. The switching circuit according to claim 7 wherein said means for emitting light comprises a light emitting diode.

9. The switching circuit according to claim 7 wherein said gate controlled bilateral switching device comprises a triac.

10. The switching circuit according to claim 7 wherein said trigger means comprises a silicon controlled rectifier.

11. The switching circuit according to claim 7 wherein said rectifier means comprises a full wave rectifier.

* * * * *